(12) United States Patent  
Anderson et al.

(10) Patent No.: US 7,414,262 B2
(45) Date of Patent: Aug. 19, 2008

(54) ELECTRONIC DEVICES AND METHODS FOR FORMING THE SAME

(75) Inventors: Frank E. Anderson, Sadieville, KY (US); Robert W. Cornell, Lexington, KY (US); Yimin Guan, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 162 days.

(21) Appl. No.: 11/241,221

(22) Filed: Sep. 30, 2005

(65) Prior Publication Data

US 2007/0075416 A1   Apr. 5, 2007

(51) Int. Cl.
*H01L 29/06* (2006.01)
(52) U.S. Cl. .................. 257/27; 257/573; 257/227; 257/142; 257/29
(58) Field of Classification Search .............. 257/72, 257/288, 573, 702, E39.016, 223, 227, 291, 257/292, 439, 443, 655, E27.1; 438/29
See application file for complete search history.

(56) References Cited

U.S. PATENT DOCUMENTS

| | | | |
|---|---|---|---|
| 5,385,848 A | | 1/1995 | Grimmer |
| 6,087,196 A | * | 7/2000 | Sturm et al. ................. 438/29 |
| 6,150,668 A | | 11/2000 | Bao et al. |
| 6,642,092 B1 | | 11/2003 | Voutsas et al. |
| 6,737,364 B2 | | 5/2004 | Black et al. |
| 6,765,249 B2 | * | 7/2004 | Voutsas et al. ............... 257/288 |
| 6,984,871 B2 | * | 1/2006 | Tanoue et al. ................ 257/573 |
| 7,279,777 B2 | * | 10/2007 | Bai et al. ..................... 257/642 |
| 2003/0193054 A1 | * | 10/2003 | Hayakawa et al. ............ 257/72 |
| 2004/0235227 A1 | | 11/2004 | Kawase |
| 2005/0022374 A1 | | 2/2005 | Hirai et al. |
| 2005/0042320 A1 | | 2/2005 | Hasei |
| 2005/0071969 A1 | | 4/2005 | Sirringhaus et al. |

OTHER PUBLICATIONS

European Patent Application No. 1503445, Published Feb. 2, 2005; Herman et al.
*Circuit explanation of Decorative light Controller*, website visited at http://www.interq.or.jp/japan/se-inoue/e_pic6_c3.htm on Jul. 25, 2005.
*Organic thin film transistors*, Colin Reese, et al., Sep. 2004 Materialstoday, pp. 20-27.
*Organic Devices on Flexible Substrates Advance*, Peter Singer, Nov. 1, 2004, Semiconductor International.
*A high-performance all-inkjetted organic transistor technology*, Steven E. Molesa et al., 2004 IEEE.

(Continued)

*Primary Examiner*—Jasmine J Clark
(74) *Attorney, Agent, or Firm*—Dinsmore & Shohl, LLP (57) ABSTRACT

Electronic devices, such as those having a flexible substrate and printed material on the flexible substrate. In one embodiment, the printed material and substrate are part of an electronic device having at least three terminals, wherein the electronic device has a charge carrier mobility of at least 10 $cm^2/V\text{-}s$. Multi-terminal devices can have a substrate including a doped semiconductor layer and at least two doped regions formed upon the substrate. The doped regions can be doped oppositely from the semiconductor layer and exhibit a charge carrier mobility of greater than 10 $cm^2/V\text{-}s$. Methods for making the same are also disclosed.

8 Claims, 6 Drawing Sheets

OTHER PUBLICATIONS

*Flexible display enabling technology*, Sigurd Wagner et al., SPIE Symp., Orlando, FL (Apr. 2001).

*Wafer Fab: Polysilicon*, website visited at http://www.SemiconFarEast.com/polysilicon.htm on Jun. 28, 2005; Copyright © 2001-2005.

European Patent Application No. 1503445, Published Feb. 2, 2005; Herman et al.

Calvert, Paul, Inkjet Printing for Materials and Devices, Chem. Mater. 2001, vol. 13, No. 10, pp. 3299-3305, American Chemical Society.

Calvert et al., Paul, Multilayer Inkjet Printing of Biopolymers, OLED's and Other Devices, www.aml.arizona.edu/~calvert/papers/calvertimaps.pdf, date unknown.

Molesa et al., Steven E., A High-Performance All-Inkjetted Organic Transistor Technology, 2004 IEEE International Electron Device Meeting Technical Digest, 2004, p. 1072, IEEE.

Molesa et al., Steven, High-Quality Inkjet-Printed Multilevel Interconnects and Inductive Components on Plastic for Ultra-Low-Cost RFID Applications, Mat. Res. Soc. Symp. Proc., vol. 769, 2003, H8.3.1-H8.3.6, Materials Reasearch Society.

Customer & Collaborator Publications, listed at www.microfab.com/about/customer_papers.pdf, 2004, MicroFab Technologies, Inc.

Burns et al., Seamus E., Abstract of Inkjet Printing of Polymer Thin-Film Transistor Circuits, MRS Bulletin, Nov. 2003, vol. 28, No. 11, Materials Research Society.

Various Abstracts from Program, Inkjet Printing of Functional Polymers and Materials, www.schubert-group.de/COMBIMAT/Program%20workshop.pdf, Jun. 2004, Dutch Polymer Inst.

Various Topics, e-newsletter, Feb. 2005, vol. 2, Issue 1, Georgia Institute of Technology Packaging Research Center, www.prc.gatech.edu/newsletter/feb2005.htm.

Kewase, T. et al., "Inkjet Printing Of Polymer Thin Film Transistors," Thin Solid Films, vol. 438-439, pp. 279-287.

Kewase, T. et al., "Inkjet Printing Of Polymer Thin Film Transistors," Thin Solid Films, vol. 438-439, pp. 279-287, 2003.

* cited by examiner

ELECTRONIC DEVICES AND METHODS FOR FORMING THE SAME

FIELD OF THE INVENTION

This invention relates to electronic devices and methods for forming the same, and, in one exemplary embodiment, more particularly to printed transistors with high charge carrier mobility and methods for forming the same.

BACKGROUND OF THE INVENTION

Traditionally, transistor production requires a highly complex, cost intensive, prolonged process. Today, due to highly developed inkjet technologies, printed transistors overcome these drawbacks and provide fast, low-cost production with high transistor yields. In addition to overcoming the drawbacks of traditional transistors, these printed transistors may be applied to flexible substrates thus allowing them to be implemented in many technologies, such as active matrix flat panel displays, RFID tags, and Smart Cards. However, because printed transistors inherently possess a charge carrier mobility drastically less than traditionally formed transistors, they have not entirely replaced conventional transistors in today's markets.

Charge carrier mobility is defined as electron or hole diffusivity per volt ($cm^2/V$-s) and is a measure of how fast charge moves through a given material when an electric field is applied. High charge carrier mobility in a transistor correlates to higher switching speeds and thus permits a transistor with high charge carrier mobility to be implemented in many applications and technologies. Printed transistors typically possess a charge carrier mobility of only around 0.01 to 1 $cm^2/V$-s, while traditionally formed transistors have charge carrier mobilities of over 100 $cm^2/V$-s.

Materials with higher charge carrier mobility than used in printed transistors typically require annealing. However, the annealing process has not been used for conventional printed transistors. Printing utilizes a flexible substrate, and conventional flexible substrates are not able to withstand the high temperatures utilized in the annealing process. Therefore, conventional printed transistors have been suited only for applications which permit slow switching speeds.

In many applications, multi-terminal electronic devices made from thin-film amorphous/polycrystalline semiconductive material, such as amorphous silicon, copper indium diselenide or cadmium telluride, have high charge carrier mobility. However, such materials typically require annealing, and typical substrates used in printing cannot withstand the high temperatures used in annealing. Therefore, other more expensive processes are utilized to produce such devices.

SUMMARY OF THE INVENTION

One aspect of the present invention is a method for forming an electronic device. The method comprises applying materials to a flexible substrate to form an electronic device, wherein at least some of the materials are applied using a printing apparatus. The substrate is annealed when at least some of the materials reside thereon.

Another aspect of the present invention is an electronic device, comprising a flexible substrate and printed material on the flexible substrate. The printed material and substrate are part of an electronic device having at least three terminals, wherein the electronic device has a charge carrier mobility of at least 10 $cm^2/V$-s.

Yet another aspect of the present invention is a method of forming a multi-terminal device. The method comprises printing dopant on a substrate having a semiconductor layer to produce a plurality of doped regions within the substrate as part of a multi-terminal device. The doped regions provide a charge carrier mobility of greater than 10 $cm^2/V$-s.

Another aspect of the present invention is a multi-terminal device. The multi-terminal device comprises a substrate, wherein the substrate includes a doped semiconductor layer; at least two doped regions formed upon the substrate. The doped regions are doped oppositely from the semiconductor layer and they exhibit a charge carrier mobility of greater than 10 $cm^2/V$-s. The multi-terminal device further comprises first and second electrodes, each electrode either being electrically coupled to the doped regions and a third electrode electrically isolated from the doped semiconductor layer. Each of the electrodes are electrically isolated from another electrode. At least one of the electrodes or at least one of the doped regions is formed by using a printing apparatus.

BRIEF DESCRIPTION OF THE DRAWINGS

It is believed that the present invention will be better understood from the following description of illustrative embodiments taken in conjunction with the accompanying drawings, wherein like reference numerals indicate corresponding structures throughout the views and in which.

DETAILED DESCRIPTION OF ILLUSTRATIVE EMBODIMENTS

Figure 1:
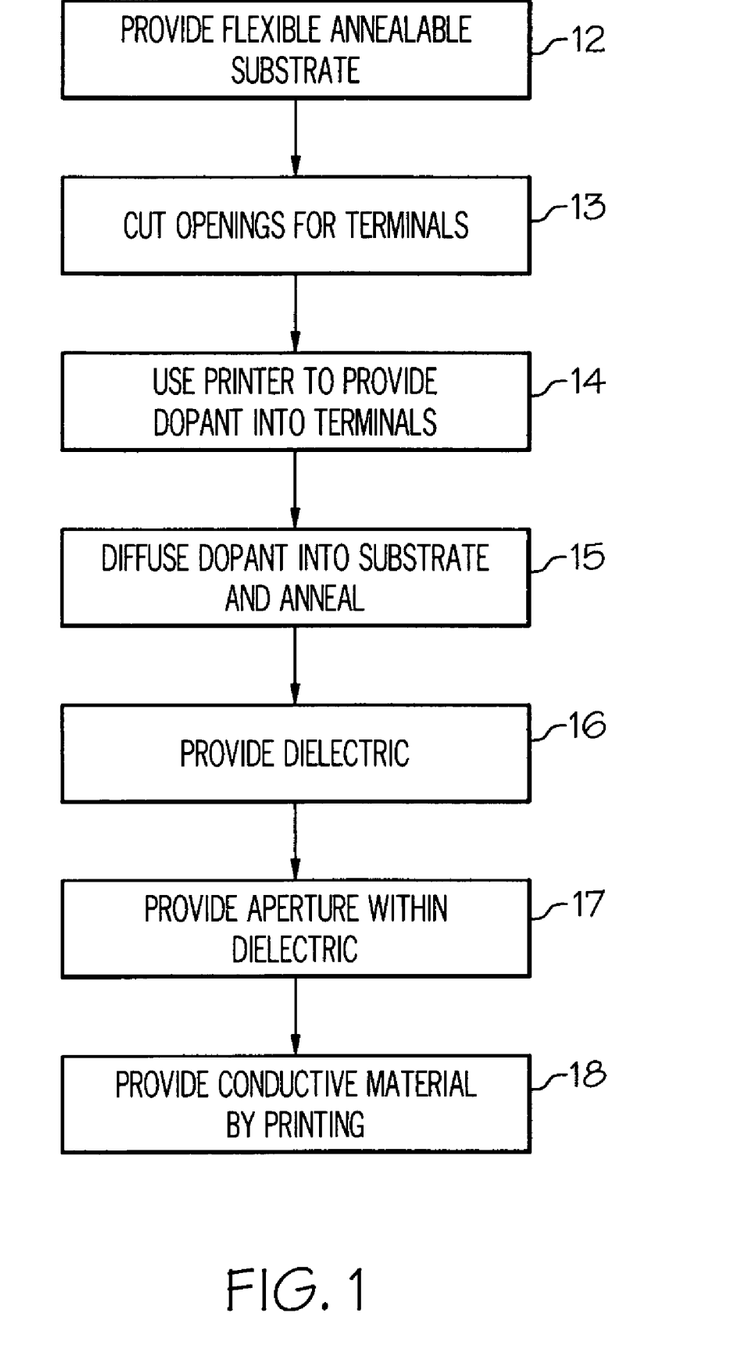
FIG. 1 is a flow diagram of a method for producing a printed, high charge carrier mobility transistor in accordance with one illustrative embodiment of the present invention.

In general, and as illustrated by the flow diagram in FIG. 1, one embodiment of the invention relates to printing a multi-terminal device with at least three terminals, such as a transistor, that has high charge carrier mobilities, such as in the range of 10 $cm^2/V$-s to 100 $cm^2/V$-s. While the illustrative embodiment demonstrates a transistor, other multi-terminal devices may be achieved, such as a thyristor, a three terminal voltage regulator, or a TRIAC. In this embodiment, a flexible semiconductor substrate is provided which can be both processed by a printing apparatus (e.g., a printer, a copier, a multi-functional device having printing functionality, such as a printer-copier-scanner, and the like) and annealed, and on which the multi-terminal device may therefore be printed. This is shown at block 12.

The substrate may be composed of a variety of stratified layers used in semiconductor technologies, and may include a semiconductor layer on a flexible backing. As shown at block 13, the substrate may be cut, such that recesses may be defined within the substrate to expose a portion of the semiconductor layer for forming the terminals. This cutting process may be achieved in numerous manners and may eliminate only a few layers from the substrate.

A dopant may be applied to the recesses and subsequently diffused so as to create doped areas with high charge carrier mobility within the semiconductor layer, as shown at blocks 14 and 15. These dopants may be donor or acceptor impurities sufficient to increase charge carrier mobilities in a semiconductor. The dopants may be applied by using a printing apparatus, such as a thermal ink jet printer for example.

The diffusing operation can include an annealing step wherein the substrate with dopants is heated to high temperatures such as by using a furnace, or a pulsed laser beam. A dielectric material may be applied to the substrate in such a manner so as to coat the substrate while also providing apertures therethrough, as shown at blocks 16 and 17 of FIG. 1. The dielectric may be applied selectively to form the apertures by use of a printing apparatus, such as a laser printer for example, or by blanket coating the dielectric and then laser cutting the apertures. The apertures can provide access to the dopant and gate areas for application of conductive material. Accordingly, the conductive material may be provided in the form of an electrode such that the conductive material is provided within the dielectric apertures and electrically connected to various areas of the substrate to form terminals, as shown at block 18. This material can be applied using a printer. Thus, according to the method of FIG. 1, an annealable and flexible substrate is processed using a printing apparatus to form a multi-terminal device which can have high charge carrier mobility.

Figure 2:
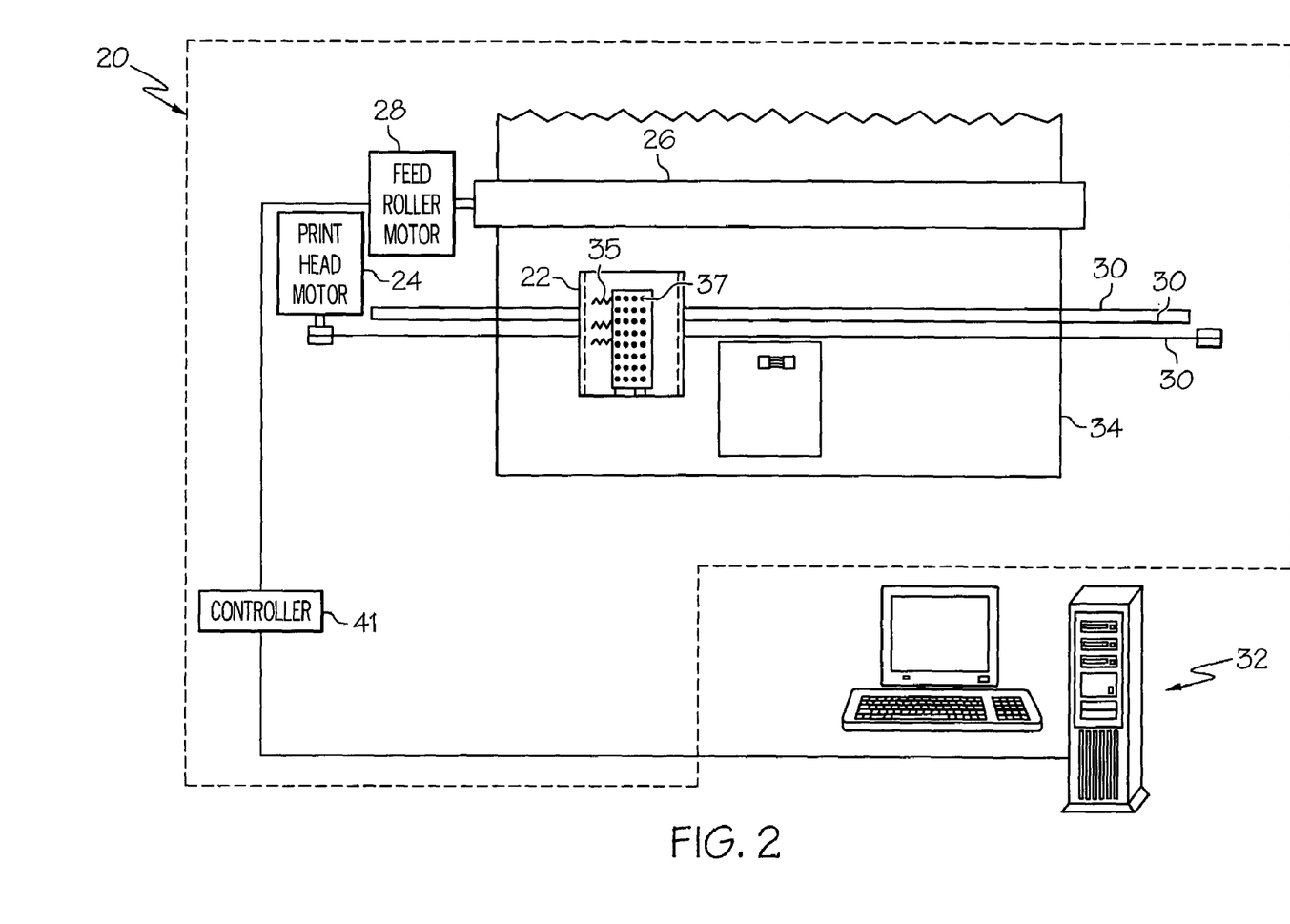
FIG. 2 is a schematic view of a printer system for printing a high charge carrier mobility transistor on a substrate in accordance with one illustrative embodiment of the present invention.

As discussed further herein, and as shown generally in FIG. 2, a printer 20 may be implemented to print a multi-terminal device on a flexible, annealable substrate 34. Printer 20 may employ an external CPU 32 (e.g., PC or laptop) to provide print commands to an internal controller 42, and may comprise a print head 22, a print head motor 24, a feed roller 26 and a feed roller motor 28. External CPU 32 may be utilized to control various aspects of the device to be printed, and, in combination with the controller 41, to control various aspects of the printer such as material or ink selection, print head speed, indexing of the substrate 34, and selective application of the materials to the substrate.

Print head motor 24 may be utilized to control print head 22 which may include nozzles for selectively applying material (e.g., ink, dopant, dielectric or conductive material) to the substrate along the same axis as print head carrier 30. Feed roller 26 and feed roller motor 28 may be utilized to supply substrate 34 through printer 20, along an axis perpendicular to print head carrier 30. Print head motor 24 and feed roller motor 28 may work in concert such that any point on substrate 34 may be accessed by print head 22, thereby facilitating formation of multi-terminal devices anywhere on substrate 34.

More specifically, and as demonstrated in the illustrative embodiment, printer 20 may be an inkjet printer which may apply dopant, dielectric and/or conductive material to create a transistor on substrate 34. In such an embodiment, printer 20 may be any thermal inkjet printer capable of ejecting fluid droplets, such as dopant, dielectric or conductive material, onto substrate 34 from thermal nozzles within inkjet print head 22 by heating the material using heaters, such as resistors 35, and ejecting the material through nozzles 37. It should be understood that although printer 20 is illustrated as a thermal inkjet printer, other printers are contemplated, such as a piezoelectric inkjet printer or a laser printer, and such printers may have a variety of components, such as disclosed in U.S. Pat. No. 6,234,612, the entire disclosure of which is hereby incorporated herein by reference. Additionally, it should be understood that if a thermal inkjet printer is employed, the fluids in print head 22 may be limited to fluids conducive to ejection from such print head 22.

Figure 3:
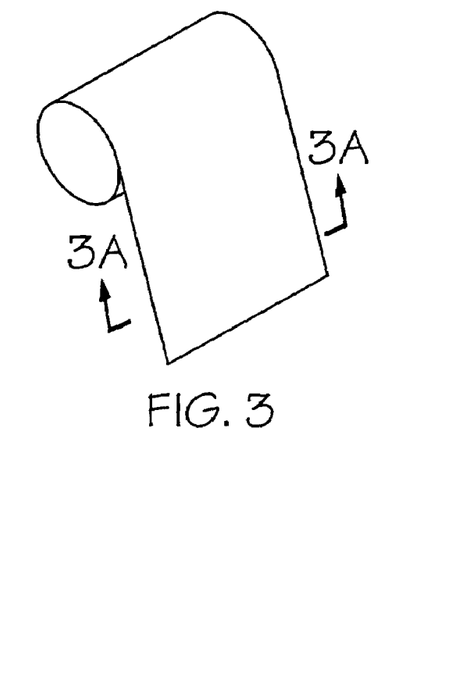
FIG. 3 is a cross sectional view of a substrate on which printed, high charge carrier mobility transistors may be produced, according to an embodiment of the present invention.
Figure 3A:
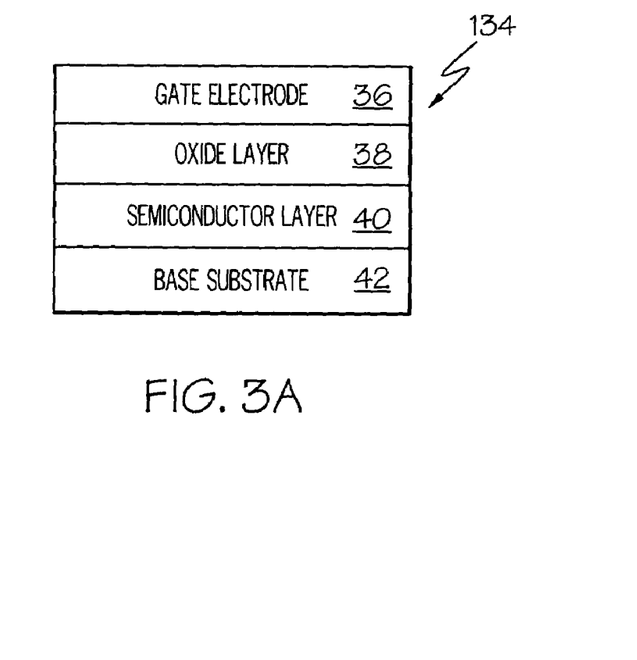

In one illustrative embodiment and as demonstrated in FIG. 3, a multi-terminal device may be printed upon a stratified substrate 134. As illustrated, stratified substrate 134 may comprise layered surfaces such as a gate electrode layer 36, an oxide layer 38, a semiconductor layer 40, and a base substrate 42. A suitable stratified substrate 134 is commercially available as Iowa Thin Films product PowerFilm, such as disclosed in U.S. Pat. No. 5,385,848, the entire disclosure of which is hereby incorporate herein by reference. Various methods may be utilized for creating the substrate 134. For example, the substrate 134 may be formed by roll coating amorphous silicon and other layers onto a flexible substrate by using a thin strip of stainless steel, so as to create an annealable and flexible product that can be processed by a printer. However, it should be understood that although stratified substrate 134 is illustrated as comprising four specific layers, each layer may comprise various materials and thicknesses depending upon the desired multi-terminal device or desired application.

Base substrate 42 may consist of a material having sufficient surface tension such that other layers of material may be applied thereupon. Base substrate 42 may also be durable enough to withstand the intense heat required during an annealing process. Although as illustrated, base substrate 42 may comprise stainless steel, other materials may be implemented to achieve the desired surface tension, flexibility, and/or durability, such as copper foil, or aluminum foil.

It is further demonstrated in the present embodiment that base substrate 42 may be a flexible material. While a material such as stainless steel may be thinly distributed to achieve flexibility, other substrates and/or thicknesses may be employed to achieve the desired rigidity or flexibility. Semiconductor layer 40 may be included within stratified substrate 134 and may comprise any material sufficient to achieve charge carrier mobilities in the range of 10 $cm^2/V$-s to 100 $cm^2/V$-s.

Although semiconductor layer 40 is illustrated in the present embodiment as an amorphous silicon layer, other semiconductor materials may be used, such as copper indium diselenide or cadmium telluride. Additionally, in order to achieve charge mobilities in the range of 10 $cm^2/V$-s to 100 $cm^2/V$-s, semiconductor layer 40 may be doped with a concentration of impurities. The impurity may either be a donor impurity, as demonstrated in the illustrative embodiment, such that an n-type semiconductor with excess holes may be formed, or the impurity or may be an acceptor impurity such that a p-type semiconductor with excess electrons may be formed.

Oxide layer 38 may be included within stratified substrate 134 and may comprise any material sufficient to electrically isolate semiconductor layer 40 from gate electrode layer 36. Although oxide layer 38 is illustrated in the present embodiment as a silicon oxide layer, other electrically isolating materials may be used, such as silicon nitride, or diamond-like carbon. Gate electrode layer 36 may be included within stratified substrate 134 and may comprise any material sufficient to ensure electrical contact with conductive material. Although gate electrode layer 36 is illustrated in the present embodiment as a polysilicon layer, other materials may be used, such as tungsten or tantalum silicide. Accordingly, substrate 134 is flexible and annealable and can be processed using a printer to form electronic devices with high charge carrier mobility, according to embodiments of the present invention.

Figure 4:
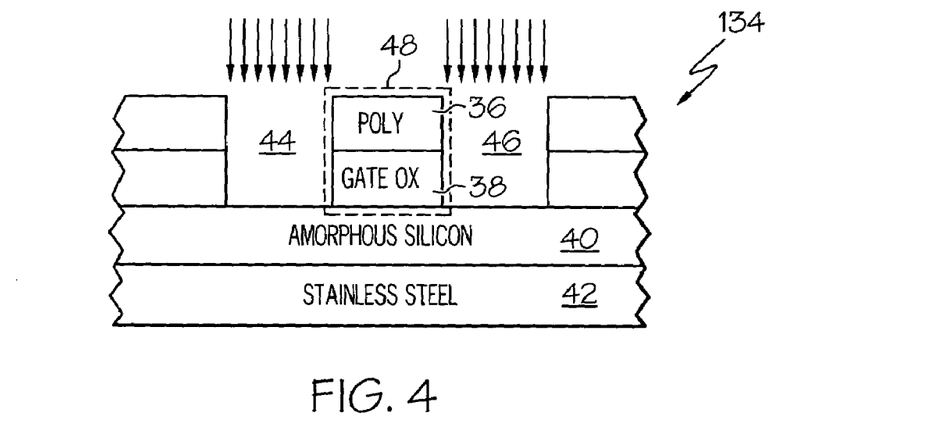
FIG. 4 is a cross sectional view of a substrate with laser cut recesses for exposing a semiconductor layer, according to an embodiment of the present invention.

As illustrated in FIG. 4, recesses 44, 46 may be formed within stratified substrate 134. These recesses 44, 46 may be implemented such that semiconductor layer 40 may be exposed and dopant may be applied therein. Because recess size and depth constraints may influence the overall performance of a multi-terminal device, the illustrative embodiment demonstrates that recesses 44, 46 may be formed via laser cutting. However, alternative processes known in the art may be employed to adhere to particular recess size and depth constraints, such as lithography (e.g., photolithography, etch masks, or shadow masks). In alternative embodiments, device or design variations may result in different recess configurations. For example, if the stratified layers within substrate 134 are varied, the depth of recesses 44, 46 may differ as a result of the varying location of semiconductor layer 40 within stratified substrate 134.

Similarly, when a continual cutting process is implemented, one continuous recess may be formed, such that other material may fill portions of the recess to define multiple recesses. Alternatively, depending on the multi-terminal device ultimately developed on substrate 134, such as for example, a thyristor, a three terminal voltage regulator, or a TRIAC, the shape, quantity and location of recesses 44, 46 may differ. Similarly, recesses 44, 46 also may be configured to provide for an integrated circuit, wherein multi-terminal devices are located throughout the configuration of recesses 44, 46.

Still referring to FIG. 4, a gate portion 48 may be formed adjacent to recesses 44, 46 and may comprise a section of gate electrode layer 36 and oxide layer 38 remaining from the formation of recesses 44, 46. Such gate portion 48 may provide electrical isolation from semiconductor layer 40. Similar to recesses 44, 46, because the width of gate portion 48 may influence overall performance of a printed, multi-terminal device, the illustrative embodiment demonstrates that gate portion 48 may be formed via laser cutting. However, other alternative processes known in the art may be employed to adhere to particular width constraints, such as lithography (e.g., photolithography, etch masks, or shadow masks).

Similar again to recesses 44, 46, in alternative embodiments, device or design variations may result in different gate portion 48 configurations. For example, when the stratified layers within substrate 134 are varied, the size of gate portion 48 may change as a result of the varying depth of semiconductor layer 40 within stratified substrate 134. Similarly, depending on the multi-terminal device ultimately developed upon substrate 134, the width, location and quantity of gate portion 48 may differ.

Figure 5:
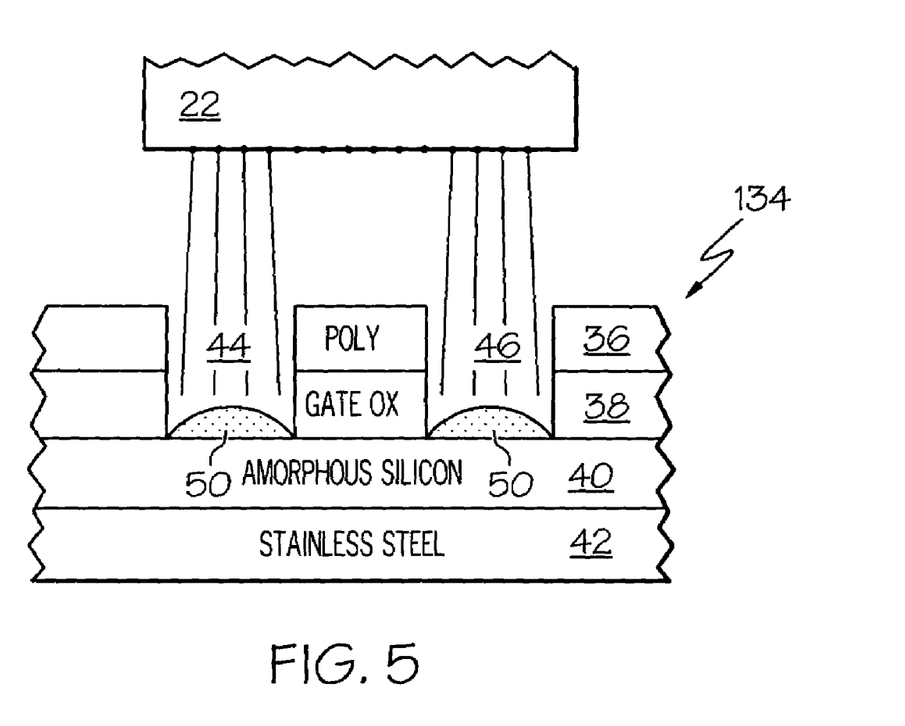
FIG. 5 is a cross sectional view of a substrate with dopant applied to recesses, according to an embodiment of the present invention.

As illustrated in FIG. 5, a dopant 50 may be applied to recesses 44, 46 for later diffusion into semiconductor layer 40 of stratified substrate 134. Dopant 50 may be a material sufficient to dope recesses 44, 46 opposite from semiconductor layer 40. For example, in the illustrative embodiment, n-type semiconductor layer 40 may be doped with an acceptor impurity such that a p-type semiconductor with excess holes may be created thereon. In an alternative embodiment, a p-type semiconductor layer 40 may be doped with a donor impurity such that a n-type semiconductor with excess electrons may be created thereon.

As demonstrated in the illustrative embodiment, dopant 50 may be an acceptor impurity of a Group III element material, such as Boron. As further demonstrated in the illustrative embodiment, dopant 50 may be applied via thermal inkjet printer wherein droplets of dopant 50 may be ejected from print head 22. However, alternative embodiments are contemplated, wherein dopant 50 may be applied using other printing techniques such as piezoelectric inkjet, laser or screen printing.

Figure 6:
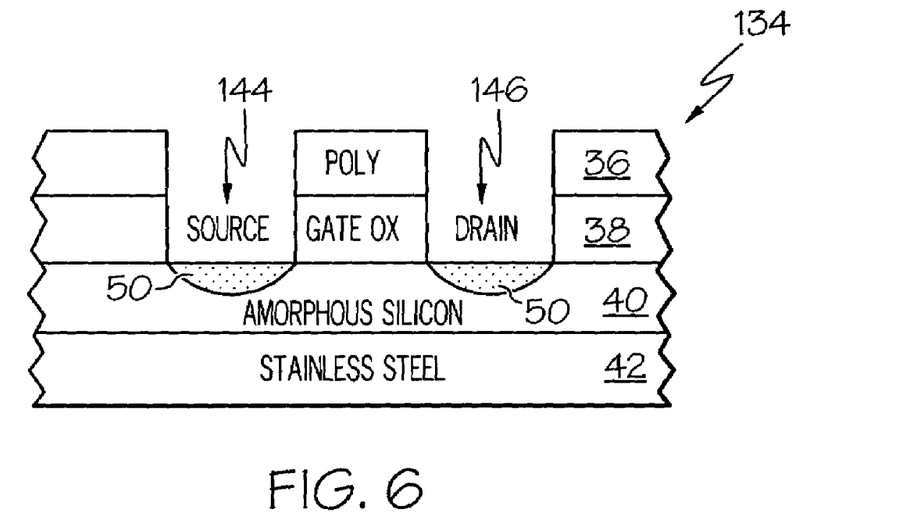
FIG. 6 is a cut away view of a substrate with dopant diffused into a semiconductor layer of a substrate, according to an embodiment of the present invention.

As illustrated in FIG. 6, dopant 50 may be diffused into semiconductor layer 40 to create doped regions 144, 146 which may be doped oppositely from semiconductor layer 40. Many diffusion methods are known in the art and may be implemented, such as localized heating with a digital source, laser, or ion implantation. However, as demonstrated in the illustrated embodiment, an annealing process which heats stratified substrate 134 to about 600-800° C. may be implemented.

Referring again to FIGS. 2-6, it should be understood that stratified substrate 134, dopant 50, and the diffusion method may affect the range of charge carrier mobilities achieved in a particular application. In the illustrative embodiment, stratified substrate 134 may be implemented, dopant material 50 may be applied and stratified substrate 134 may be annealed in order to achieve a desired charge carrier mobility range of 10 cm$^2$/V-s to 100 cm$^2$/V-s. However, it should be understood that any suitable stratified substrate 134, dopant 50, and diffusion method may be implemented to achieve a charge carrier mobility range of 10 cm$^2$/V-s to 100 cm$^2$/V-s. In an exemplary embodiment, the flexibility of the substrate 134 allows for the dopant and/or other materials to be applied using a printer, such as a laser printer or an inkjet printer for example.

Figure 7:
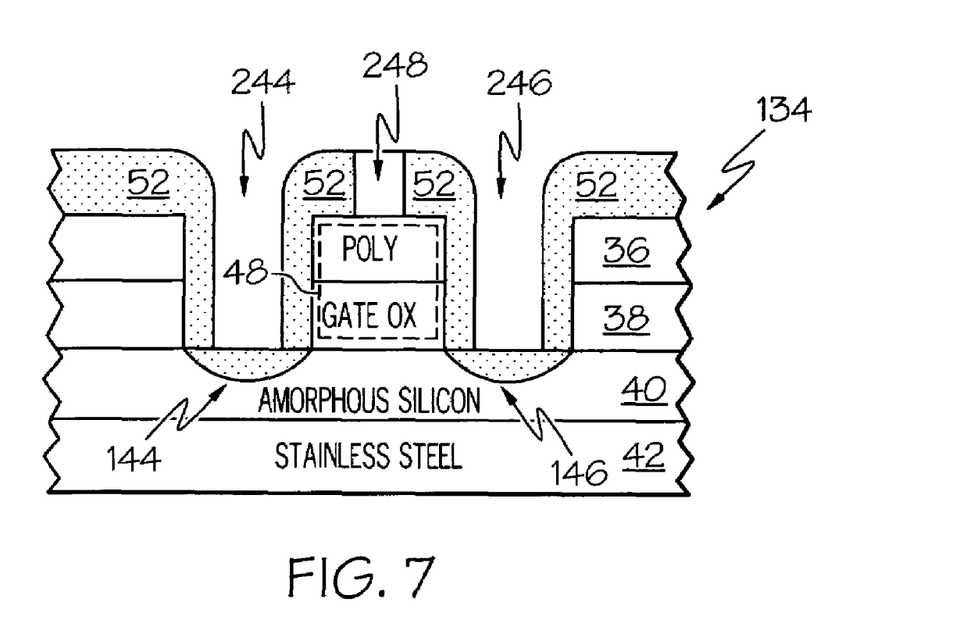
FIG. 7 is a cross sectional view of a substrate with dielectric applied to the substrate and apertures within the dielectric for providing electrodes therethrough, according to an embodiment of the present invention.

As illustrated in FIG. 7, a dielectric material 52 may be applied to stratified substrate 134 such that current flow through dielectric material 52 may be limited, thereby reducing leakage current and unwanted heat throughout a multi-terminal device implemented on stratified substrate 134. In the illustrative embodiment, dielectric material 52 may be spun-on-glass and may be applied as a blanket coat using a spin coating process. However, in alternative embodiments, other dielectric materials may be implemented, such as polystyrene, and other application methods may be implemented, such as application via printer, reel-to-reel application or any other method known in the art. For example, dielectric material 52 could be selectively applied via a laser printer. Dielectric material 52 and the application method may be implemented to comport with a particular multi-terminal device, however, because dielectric material 52 may not be necessary in a particular multi-terminal device, dielectric material 52 may be absent altogether from stratified substrate 134.

Still referring to FIG. 7, when dielectric material 52 is applied to stratified substrate 134, apertures 244, 246 may be created through dielectric material 52 and may provide access to doped regions 144, 146 and gate portion 48 of stratified substrate 134. If dielectric material 52 is blanket coated, as demonstrated in the illustrative embodiment, apertures 244, 246 may be opened using laser cutting or any other method appropriate for selectively removing dielectric material, such as wet, or dry etching. If dielectric material 52 is applied via printer, apertures 244, 246 may be formed by selectively applying dielectric material 52 around each desired aperture. It should be understood that apertures 244, 246 are merely demonstrated to comport with a printed transistor by providing access to doped regions 144, 146 and gate portion 48, and may be any size, location or quantity depending upon the desired multi-terminal device or application.

Figure 8:
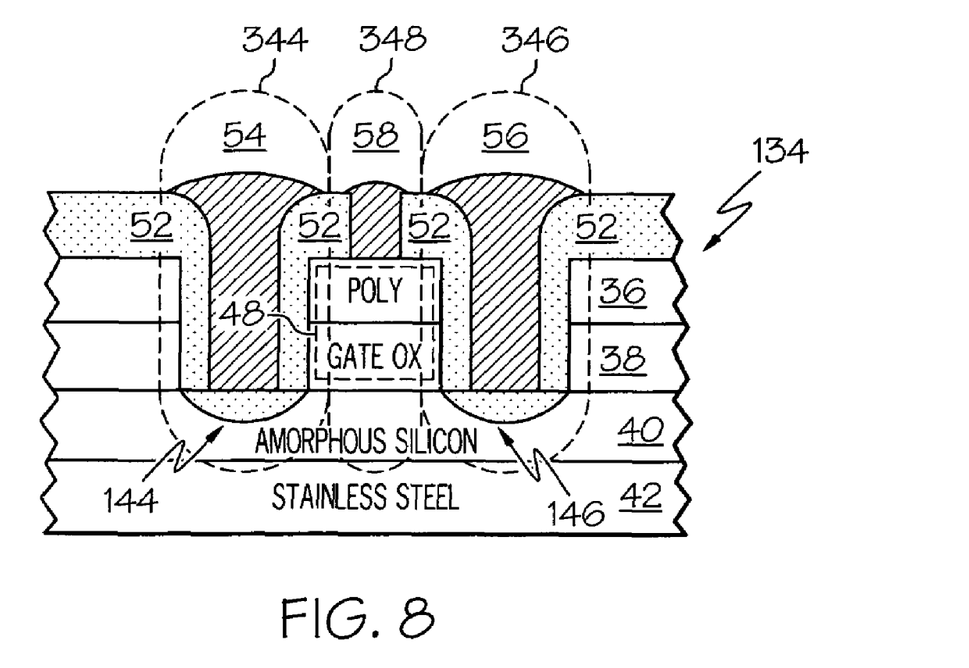
FIG. 8 is a cross sectional view of a printed, high charge carrier mobility transistor on a substrate, according to an embodiment of the present invention.

As illustrated in FIG. 8, electrodes 54, 56 may be electrically coupled to doped regions 144, 146 while electrode 58 may be electrically coupled to gate portion 48. In the illustrated embodiment, electrodes 54, 56 and 58 may be applied via a thermal inkjet printer through apertures 244, 246 and electrodes 54, 56 and 58 may be any conductive material capable being ejected from a printer, such as silver ink or copper ink, or gold ink or other conductive ink. Although a thermal inkjet printer is demonstrated in the illustrative embodiment, as discussed above, other printing techniques may be implemented such as piezoelectric inkjet or laser printing. In the illustrative embodiment, electrodes 54, 56 and 58 may be electrically coupled to produce terminals, such that electrodes 54, 56 facilitate electron flow through semiconductor layer 40 and electrode 56 facilitates application of a particular charge to enable such electron flow. It should be understood that electrodes 54, 56 and 58 are merely demonstrated to comport with a transistor by facilitating electron flow to doped regions 144, 146 and application of a charge to gate portion 48, and may be any size, location or quantity depending upon the desired multi-terminal device or application.

In the illustrative embodiment and still referring FIG. 8, the multi-terminal device printed on stratified substrate 134 may be a printed transistor. Such a transistor may comprise doped regions 144, 146 within semiconductor layer 40 which are electrically coupled to electrodes 54 and 56, respectively. The embodiment may also comprise a gate portion 48 which is electrically coupled to electrode 58.

Figure 9:
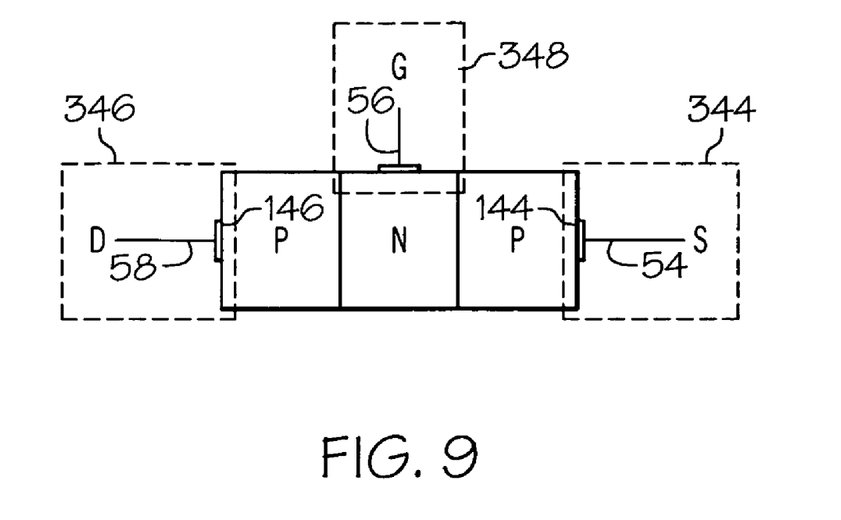
FIG. 9 is a cross sectional view of an electrical representation of a transistor that can be produced according to principles of the present invention.

The structure formed by doped region 144 and electrode 54 may commonly be referred to as a source 344 and the structure formed by doped region 146 and electrode 56 may commonly be referred to as a drain 346. Similarly, the other structure formed by gate portion 48 and electrode 58 may commonly be referred to as a gate 348. As illustrated, gate 348 may be positioned between source 344 and drain 346 such that source 344 and drain 346 facilitate electron flow to the doped regions 144, 146 of semiconductor layer 40 and gate 348 facilitates application of a particular polarity to enable electron flow therebetween. Consistent with the transistor illustrated in FIG. 8, FIG. 9 illustrates an electrical representation of such transistor so that an additional illustrative embodiment may be demonstrated and understood.

Figure 10:
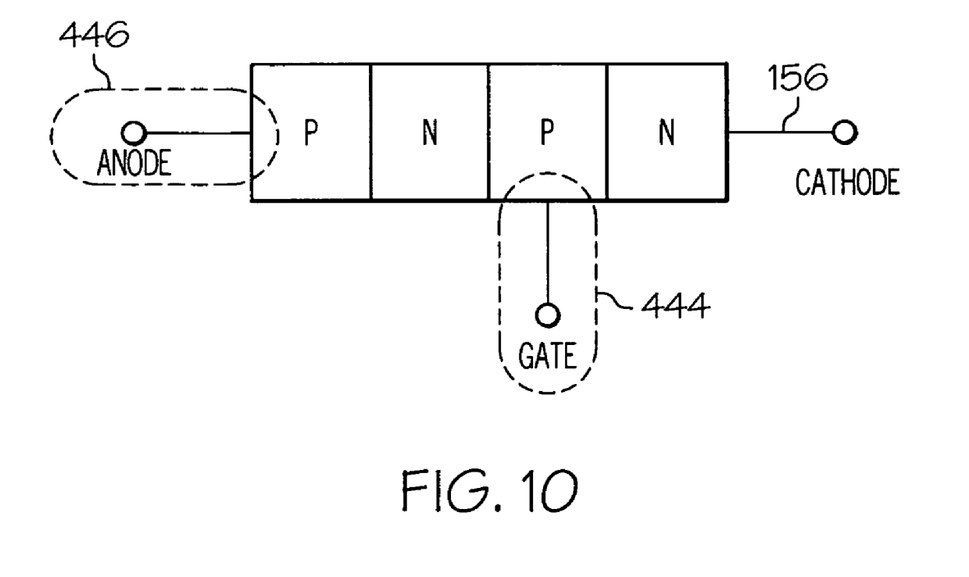
FIG. 10 is a cross sectional view of an electrical representation of a thyristor that can be produced according to principles of the present invention.

As illustrated electrically in FIG. 10, an additional embodiment of a multi-terminal device may be a thyristor. Such a thyristor may comprise an anode, cathode and gate. It should be understood to one skilled in the art that similar components disclosed above comprise the current embodiment and that the current embodiment ay be achieved through similar methods. For example, and as illustrated in FIGS. 2-8, recesses 204, 206 may be formed within a flexible, stratified substrate 134 such that n-type semiconductor layer 40 may be exposed and printed thereon using a printer. Additionally, n-type semiconductor layer 40 may be doped with an acceptor impurity such that a p-type semiconductor with excess holes may be created within recesses 144, 146. Similarly, dielectric material 52 may be provided over stratified substrate 134.

Apertures 244, 246, together with electrodes 54, 56 may provide electrical connection to doped regions 144, 146 to create gate 444 and anode 446, but aperture 248 may be provided outside doped regions 144, 146 such that electrode 56 may be electrically connected to a gate portion 48 lying outside of doped regions 144, 146 to create cathode 156. The dopant 50, dielectric 52, electrodes 54, 56 and 58, and/or other materials can be applied by a printer to create this three terminal device. The device will exhibit high charge carrier mobility, such as in the range of 10 cm$^2$/V-s to 100 cm$^2$/V-s and therefore can be used in applications where high switching speed is desired.

The foregoing description of the various embodiments of the invention has been presented for the purposes of illustration and description. It is not intended to be exhaustive or to limit the invention to the precise form disclosed. Many alternatives, modifications and variations will be apparent to those skilled in the art of the above teaching. Accordingly, while some of the alternative embodiments of the printed transistor with high charge carrier mobility and the methods for producing such have been discussed specifically, other embodiments will be apparent or relatively easily developed by those of ordinary skill in the art. Accordingly, this invention is intended to embrace all alternatives, modifications and variations that have been discussed herein.

What is claimed is:

1. An electronic device, comprising:
   a flexible substrate comprising a base substrate of a flexible metal and a semiconductor layer formed adjacent to the base substrate; and
   printed material on the flexible substrate, wherein the printed material and substrate are part of the electronic device having at least three terminals, wherein the electronic device has a charge carrier mobility of at least 10 cm$^2$/V-s.

2. The electronic device as recited in claim 1, wherein the flexible substrate is annealable, and wherein the printed material comprises at least one of a dielectric, a dopant, and a conductive material.

3. The electronic device as recited in claim 1, wherein the printed material comprises a dopant applied to the flexible substrate using an inkjet printer, wherein the flexible substrate and printed material are annealed to form doped regions.

4. The device as recited in claim 1, wherein the printed material is printed using a thermal ink jet printing apparatus having heating elements for ejecting the material as droplets toward the substrate.

5. The device as recited in claim 1, wherein the device comprises a transistor.

6. The device as recited in claim 1, wherein the device has gate, source and drain terminals.

7. A multi-terminal device comprising:
   a substrate, wherein said substrate includes a doped semiconductor layer;
   at least two doped regions formed upon said substrate, wherein said doped regions are doped oppositely from said semiconductor layer;
   wherein said doped regions exhibit a charge carrier mobility of greater than 10 cm$^2$/V-s; and
   first and second electrodes, each electrode either being electrically coupled to said doped regions;
   a third electrode electrically isolated from said doped semiconductor layer, each of said electrodes being electrically isolated from another electrode;
   wherein at least one of said electrodes or at least one of said doped regions is formed by using a printer.

8. The device according to claim 7, wherein said substrate is flexible and annealable.

* * * * *